United States Patent [19]

Shih

[11] Patent Number: 5,914,203
[45] Date of Patent: Jun. 22, 1999

[54] TRANSMISSION MODULATION MASK

[75] Inventor: Tah-Te Shih, Taipei, Taiwan

[73] Assignee: Vanguard International Semiconductor Corporation, Hsin-Chu, Taiwan

[21] Appl. No.: 08/938,570

[22] Filed: Sep. 26, 1997

[51] Int. Cl.[6] .................................................. G03F 9/00
[52] U.S. Cl. .................................................. 430/5
[58] Field of Search .............................. 430/5, 311, 322

[56] References Cited

U.S. PATENT DOCUMENTS

| | | | |
|---|---|---|---|
| 5,429,896 | 7/1995 | Hasegawa et al. | 430/5 |
| 5,439,765 | 8/1995 | Nozue | 430/5 |
| 5,478,679 | 12/1995 | Loong et al. | 430/5 |
| 5,482,799 | 1/1996 | Isao et al. | 430/5 |
| 5,679,484 | 10/1997 | Ito et al. | 430/5 |
| 5,725,975 | 3/1998 | Nakamura et al. | 430/5 |

*Primary Examiner*—S. Rosasco
*Attorney, Agent, or Firm*—George O. Saile; Stephen B. Ackerman; Larry J. Prescott

[57] ABSTRACT

A transmission modulation mask comprising a first pattern formed of opaque or non light transmitting material and a second pattern formed of partially transmitting material. The light passing through the transmission modulation mask forms interference patterns which improve the edge definition and depth of focus of the image formed on a semiconductor wafer. The transmission modulation mask is particularly useful for small contact hole formation requiring a high degree of dimensional control such as the formation of stacked capacitors for DRAM circuits.

12 Claims, 3 Drawing Sheets

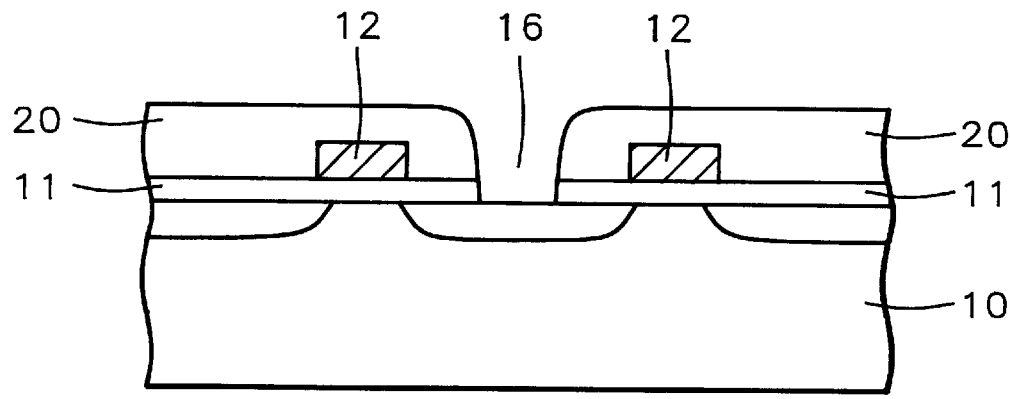
FIG. 1A – Prior Art
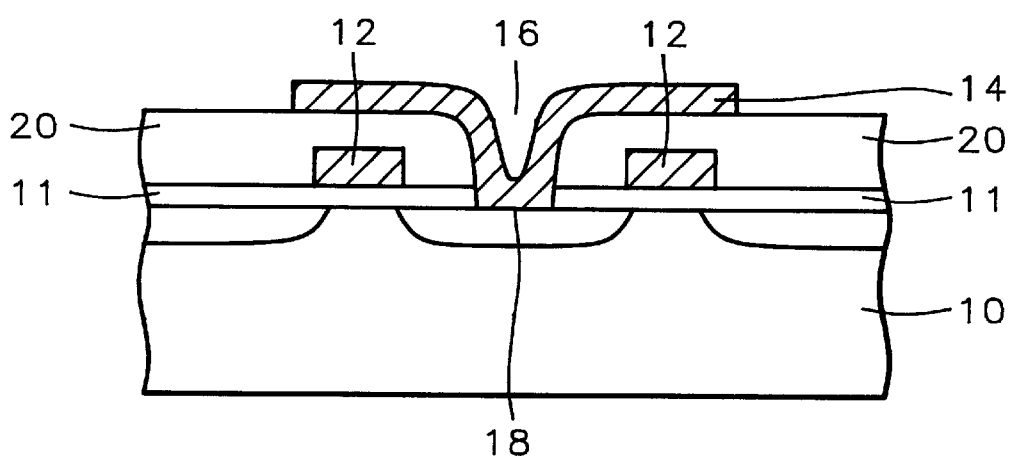
FIG. 1B – Prior Art
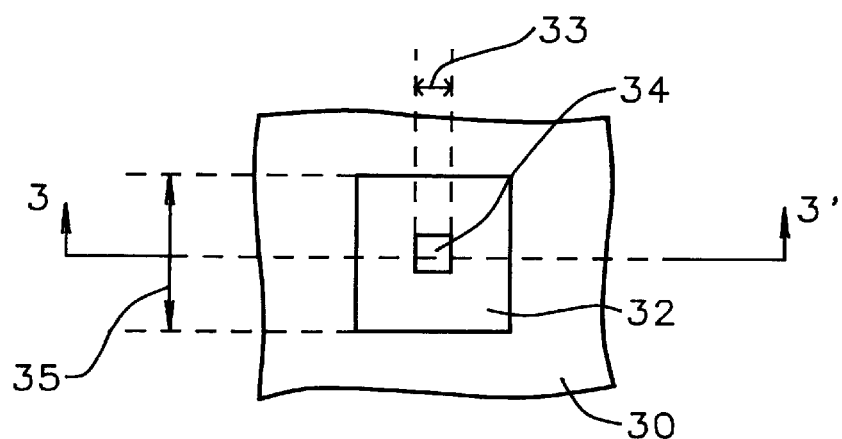
FIG. 2

5,914,203

TRANSMISSION MODULATION MASK

BACKGROUND OF THE INVENTION

(1) Field of the Invention

This invention relates to masks used in photolithographic processes in the formation of semiconductor integrated circuits. The invention has particular application in the manufacture of stacked capacitors used in DRAM, dynamic random access memory, circuits.

(2) Description of the Related Art

The transmission modulation mask of this invention uses a mask having a first pattern formed of a material having zero light transmission and a second pattern formed of a material having partial light transmission. The light passing through the transmission modulation mask forms an interference pattern which improves the edge definition and depth of focus of the image. The transmission modulation mask is less costly than a phase shifting mask, uses thin chrome for the partially transmitting second pattern, and thicker chrome for the opaque or non transmitting first pattern.

U.S. Pat. No. 5,439,765 to Nozue shows a phase shift mask which removes chrome in certain mask areas. Chrome is used as an opaque material and not as a partially transmitting material.

U.S. Pat. No. 5,482,799 to Isao et al. shows masks using phase shifting materials, which shift the phase of the transmitted light by 180°, and partially transmitting materials, which adjust the light transmission from 3% to 20%.

SUMMARY OF THE INVENTION

In the manufacture of semiconductor integrated circuit devices precise tolerances are often required for optical lithography steps. The fabrication of many devices, such as stacked capacitors or crown capacitors used in dynamic random access memory or DRAM circuits, require precise tolerances. FIGS. 1A and 1B show cross section views of a stacked capacitor in a DRAM at different stages of fabrication.

As shown in FIG. 1A the DRAM comprises a semiconductor substrate 10, a gate oxide layer 11, gate electrodes 12, and an insulating layer 20. A small opening 16 having precise tolerances must be formed in the insulating layer 20 so the bottom plate of the stacked or crown capacitor can form electrical contact with the DRAM. FIG. 1B shows the bottom plate 14 of the capacitor forming electrical contact 18 with the DRAM. Phase shift masks have been used for the above described purpose but they have the disadvantage of high cost and being difficult to control.

It is the principle objective of this invention to provide a transmission modulation mask which will provide precise tolerances at reduced cost.

It is another principle object of this invention to provide a method of forming precise features on a semiconductor substrate using a transmission modulation mask.

This objective is achieved with a transmission modulation mask. The feature patterns of the transmission modulation mask has regions of zero light transmission adjacent to regions of partial light transmission, having light transmission of about 40%. The transmission modulation mask modulates the light intensity at the resist layer forming the device feature and results in improved dimensional control. The transmission modulation mask uses thin chrome to form the regions of partial light transmission and is less costly than a phase shifting mask.

BRIEF DISCRIPTION OF THE DRAWINGS

FIG. 1A shows a cross section view of a prior art DRAM device with a contact hole formed in an insulating layer for a stacked capacitor.

FIG. 1B shows a cross section view of a prior art DRAM device with the bottom plate of a stacked capacitor formed.

FIG. 2 shows a top view of the transmission modulation mask of this invention.

DESCRIPTION OF THE PREFERRED EMBODIMENTS

Figures 3, 4:
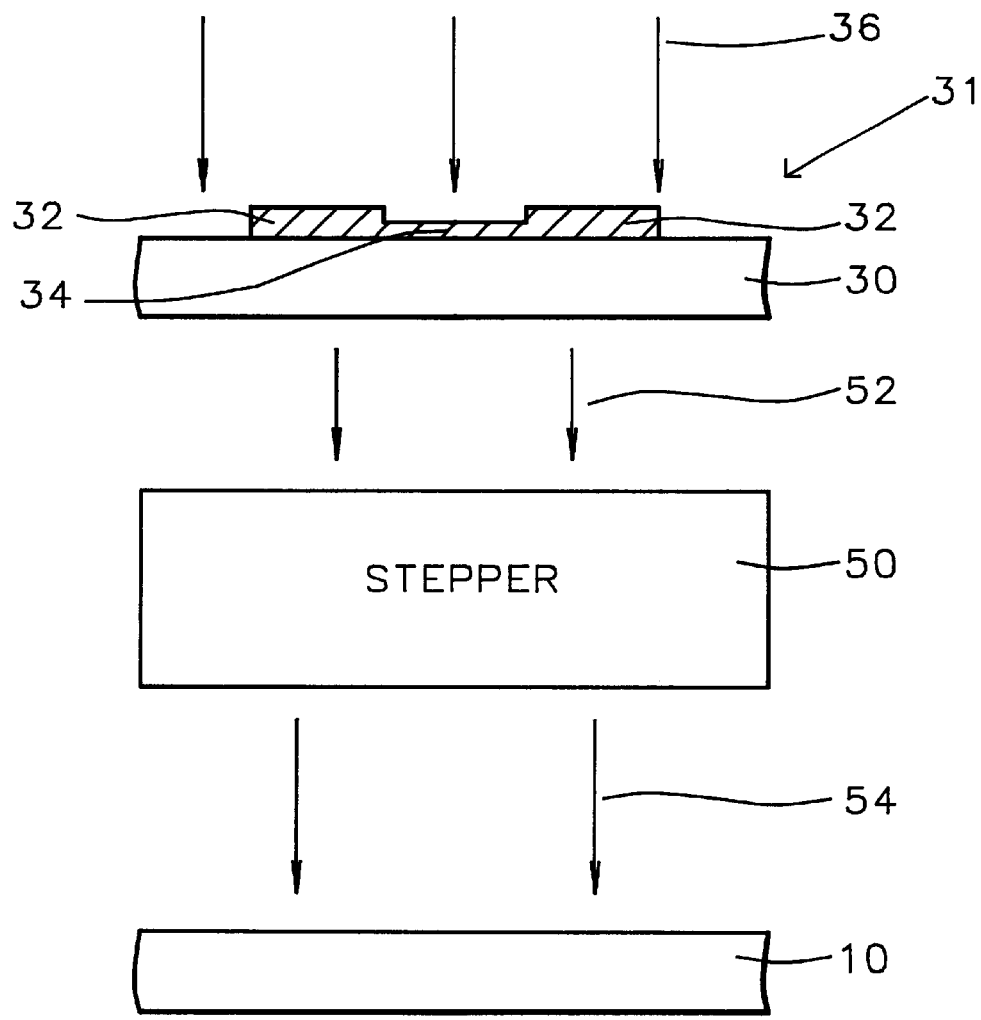
FIG. 3 shows a cross section view of the transmission modulation mask.
FIG. 4 shows a block diagram of a Stepper using the transmission modulation mask.

Refer now to FIGS. 2 and 3, there is shown an embodiment of the transmission modulation mask of this invention. As shown in FIG. 2, a first pattern 32 of opaque, or non light transmitting, material is formed on a transparent substrate 30. In this example the opaque, or non light transmitting, material is chrome having a thickness of between about 800 and 1200 Angstroms and the transparent substrate 30 is quartz having a thickness of between about 0.2 and 0.4 inches. A second pattern 34 of partially light transmitting material is then formed on the transparent substrate 30. The partially light transmitting material is chosen to have a light transmission of between about 40% and 60% of the light power incident on the second pattern 34. In this example the partially light transmitting material is also chrome having a thickness of between about 400 and 800 Angstroms. The thickness of the chrome forming the second pattern 34 is adjusted to provide a light transmission of between about 56% and 60%.

FIG. 3 shows a cross section of the mask along the line 3-3' in FIG. 2. FIG. 3 shows the thickness difference of the chrome forming the opaque first pattern 32 and the partially transmitting second pattern 32 formed on the transparent substrate 30.

Figure 5:
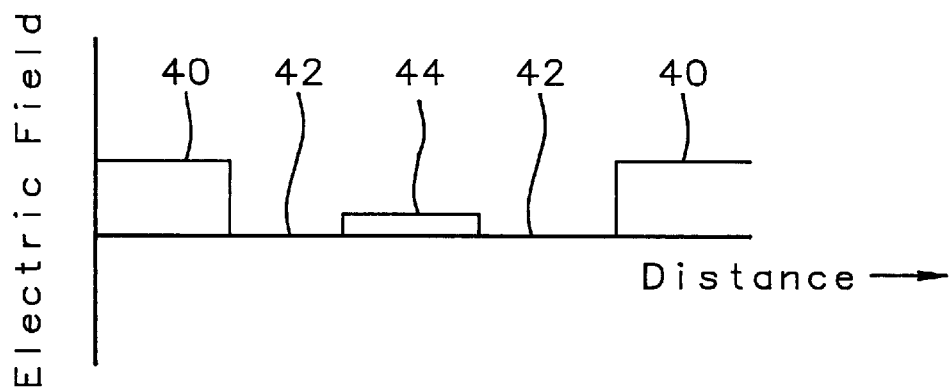
FIG. 5 shows the electric field of the light passing through the transmission modulation mask.

FIG. 4 shows a block diagram of a stepper 50 using the transmission modulation mask 31 to form an image on a semiconductor wafer 10. A beam of light 36 having a wavelength of about 365 nanometers (the wavelength of an i-line source) is directed toward the transmission modulation mask 31. The light beam 52 emerging from the mask is made up of that part of the incident light beam passing only through the transparent mask substrate 30 and that part of the incident light beam passing through the partially transmitting second pattern 34. The opaque first pattern 32 passes no light from the incident beam 36 to the beam 52 emerging from the mask. FIG. 5 shows a curve of the electric field of the light emerging from the transmission modulation mask showing the unattenuated beam 40, the part of the beam with zero transmission 42, and the part of the beam with partial transmission 44.

Figure 6:
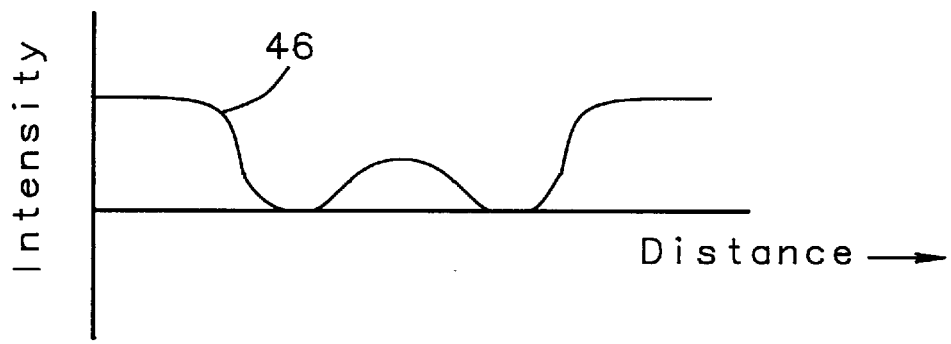
FIG. 6 shows the intensity of the light passing through the transmission modulation mask at the semiconductor wafer.

Returning again to FIG. 4, light beam 54 emerging from the stepper 50 is focused on the semiconductor wafer 10 in order to form the image of the feature being formed. FIG. 6 shows the light intensity 46 of the light at the surface of the semiconductor wafer. The transmission modulation of the mask forms an improved definition of the feature being formed on the semiconductor substrate. Interference patterns of the modulated light provides improved edge definition and depth of focus.

In this embodiment the first pattern 32 and second pattern 34 of the transmission modulation mask are squares having corresponding sides parallel and a common center point, see FIG. 2. In this example the sides 35 of the first pattern 32 are between about 0.58 and 0.86 microns long. The sides of the second pattern 34 are between about 0.29 and 0.60 microns long. It will be apparent to those skilled in the art that other shapes and/or patterns will work equally well.

While the invention has been particularly shown and described with reference to the preferred embodiments thereof, it will be understood by those skilled in the art that various changes in form and details may be made without departing from the spirit and scope of the invention.

What is claimed is:

1. A transmission modulation mask, comprising:

a transparent substrate;

a first pattern formed in a first material on said transparent substrate wherein said first pattern is a first square having zero light transmission; and a second pattern formed in a second material on said transparent substrates wherein said second pattern is a second square having partial light transmission, said first square and said second square have the same center point, and corresponding sides of said first square and said second square are parallel.

2. The transmission modulation mask of claim 1 wherein said transparent substrate is quartz having a thickness of between about 0.2 and 0.4 inches.

3. The transmission modulation mask of claim 1 wherein said first material is chrome having a thickness of between about 800 and 1200 Angstroms.

4. The transmission modulation mask of claim 1 wherein said second material is chrome having a thickness of between about 400 and 800 Angstroms.

5. The transmission modulation mask of claim 1 wherein said second pattern transmits between about 40% and 60% of the light power incident on said second pattern.

6. The transmission modulation mask of claim 1 wherein the sides of said first square are between about 0.58 and 0.86 microns long and the sides of said second square are between about 0.29 and 0.60 microns long.

7. A method of forming features on a semiconductor substrate, comprising the steps of:

providing a transmission modulation mask having a first pattern formed in a first material on a transparent substrate and a second pattern formed in a second material on said transparent substrate wherein, said first pattern has zero light transmission, said second pattern has partial light transmission, said first pattern is a first square, said second pattern is a second square, said first square and said second square have the same center point, and corresponding sides of said first square and said second square are parallel;

providing a stepper;

providing a semiconductor substrate;

projecting light through said transmission modulation mask; and focussing said light projected through said transmission modulation mask on said semiconductor substrate using said stepper.

8. The method of claim 7 wherein said transparent substrate is quartz having a thickness of between about 0.2 and 0.4 inches.

9. The method of claim 7 wherein said first material is chrome having a thickness of between about 800 and 1200 Angstroms.

10. The method of claim 7 wherein said second material is chrome having a thickness of between about 400 and 800 Anstroms.

11. The method of claim 7 wherein said second pattern transmits between about 40% and 60% of the light power incident on said second pattern.

12. The method of claim 7 wherein the sides of said first square are between about 0.58 and 0.86 microns long and the sides of said second square are between about 0.29 and 0.60 microns long.

* * * * *